United States Patent
Tabuchi et al.

(10) Patent No.: US 12,501,651 B2
(45) Date of Patent: Dec. 16, 2025

(54) SEMICONDUCTOR DEVICE

(71) Applicant: Mitsubishi Electric Corporation, Tokyo (JP)

(72) Inventors: Shinichi Tabuchi, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 462 days.

(21) Appl. No.: 18/000,232

(22) PCT Filed: Oct. 22, 2020

(86) PCT No.: PCT/JP2020/039707
§ 371 (c)(1),
(2) Date: Nov. 29, 2022

(87) PCT Pub. No.: WO2022/085151
PCT Pub. Date: Apr. 28, 2022

(65) Prior Publication Data
US 2023/0207681 A1    Jun. 29, 2023

(51) Int. Cl.
*H10D 30/66*    (2025.01)
*H10D 62/10*    (2025.01)
*H10D 62/832*    (2025.01)

(52) U.S. Cl.
CPC ......... *H10D 30/665* (2025.01); *H10D 62/107* (2025.01); *H10D 62/8325* (2025.01)

(58) Field of Classification Search
CPC .. H10D 30/665; H10D 30/66; H10D 62/8325; H10D 62/106
See application file for complete search history.

(56) References Cited

U.S. PATENT DOCUMENTS

| | | | |
|---|---|---|---|
| 2017/0077087 A1* | 3/2017 | Horikawa | ............... H10D 8/00 |
| 2020/0212183 A1 | 7/2020 | Utsumi et al. | |
| 2020/0365721 A1* | 11/2020 | Lichtenwalner | ....... H10D 62/60 |

FOREIGN PATENT DOCUMENTS

| | | |
|---|---|---|
| CN | 111384179 A | 7/2020 |
| JP | 2003-318388 A | 11/2003 |

(Continued)

OTHER PUBLICATIONS

International Search Report issued in PCT/JP2020/039707; mailed Dec. 28, 2020.

(Continued)

*Primary Examiner* — Alia Sabur
(74) *Attorney, Agent, or Firm* — Studebaker Brackett PLLC

(57) ABSTRACT

A semiconductor device includes a first semiconductor layer, a second semiconductor layer provided on the first semiconductor layer and having impurity concentration lower than impurity concentration of the first semiconductor layer, a well region provided on an upper surface side of the second semiconductor layer in the active region, a source region provided on an upper surface side of the well region, a high concentration region provided on the upper surface side of the second semiconductor layer in the termination region and having impurity concentration higher than impurity concentration of the well region, a gate electrode provided immediately above the well region and a source electrode electrically connected to the source region and the high concentration region, wherein the first semiconductor layer has an impurity concentration of equal to or greater than $4 \times 10^{18}$ cm$^{-3}$ and has a thickness of equal to or greater than 4 μm.

6 Claims, 4 Drawing Sheets

(56) References Cited

FOREIGN PATENT DOCUMENTS

| | | | |
|---|---|---|---|
| JP | 2015-056644 A | 3/2015 | |
| JP | 2017-112171 A | 6/2017 | |
| JP | 2018-200920 A | 12/2018 | |
| JP | 2020-141130 A | 9/2020 | |
| WO | WO-2015193965 A1 * | 12/2015 | ............ H01L 29/12 |
| WO | 2020/208761 A1 | 10/2020 | |

OTHER PUBLICATIONS

An Office Action; "Notice of Reasons for Refusal," mailed by the Japanese Patent Office on Oct. 10, 2023, which corresponds to Japanese Patent Application No. 2022-556327 and is related to U.S. Appl. No. U.S. Appl. No. 18/000,232; with English language translation.

An Office Action; "Notice of Reasons for Refusal," mailed by the Japanese Patent Office on Feb. 13, 2024, which corresponds to Japanese Patent Application No. 2022-556327 and is related to U.S. Appl. No. 18/000,232; with English language translation.

An Office Action; mailed by the China National Intellectual Property Administration of the People's Republic of China on Mar. 1, 2025, which corresponds to Chinese Patent Application No. 202080106313.9 and is related to U.S. Appl. No. 18/000,232.

* cited by examiner

SEMICONDUCTOR DEVICE

FIELD

The present disclosure relates to a semiconductor device.

BACKGROUND

PTL 1 discloses a semiconductor device including an n-type substrate which is a hexagonal semiconductor substrate including silicon carbide. A semiconductor layer including an n-type drift layer is formed on the substrate. In a termination region enclosing a device region, a p-type first semiconductor region is formed on an upper surface of the semiconductor layer. A silicide layer is formed on an upper surface of the first semiconductor region. A contact plug is connected to the first semiconductor region via the silicide layer. In plan view, the first semiconductor region has a circular structure that connects a first extending portion extending in a first direction, a second extending portion extending in a second direction, a third extending portion extending in a third direction and a fourth extending portion extending in a fourth direction.

CITATION LIST

Patent Literature

[PTL 1] JP 2017-112171 A

SUMMARY

Technical Problem

PTL 1 prevents expansion of a stacking fault by improving distribution of pn currents flowing through a termination region. However, hole density in an active region is not taken into account, and thus, there is a possibility that degradation of electrical characteristics cannot be sufficiently suppressed.

The present disclosure is directed to providing a semiconductor device for which degradation of electrical characteristics can be suppressed.

Solution to Problem

A semiconductor device according to the present disclosure includes a semiconductor layer including an active region in which a MOSFET is formed and a termination region enclosing the active region in plan view, a gate electrode provided on an upper surface of the semiconductor layer, a source electrode provided on the upper surface of the semiconductor layer; and a drain electrode provided on an opposite surface of the upper surface of the semiconductor layer, wherein the semiconductor layer includes a first semiconductor layer of a first conductive type, a second semiconductor layer of the first conductive type, provided on an upper surface of the first semiconductor layer and having impurity concentration lower than impurity concentration of the first semiconductor layer, a well region of a second conductive type, provided on an upper surface side of the second semiconductor layer in the active region, a source region of the first conductive type, provided on an upper surface side of the well region and a high concentration region of the second conductive type, provided on the upper surface side of the second semiconductor layer in the termination region and having impurity concentration higher than impurity concentration of the well region, the gate electrode is provided immediately above the well region, the source electrode is electrically connected to the source region and the high concentration region, and the first semiconductor layer has an impurity concentration of equal to or greater than $4 \times 10^{18}$ cm$^{-3}$ and has a thickness of equal to or greater than 4 µm.

Advantageous Effects of Invention

In a semiconductor device according to the present disclosure, hole density in an active region can be reduced by providing a first semiconductor layer, so that it is possible to suppress degradation of electrical characteristics of the semiconductor device.

DESCRIPTION OF EMBODIMENTS

Figure 1:
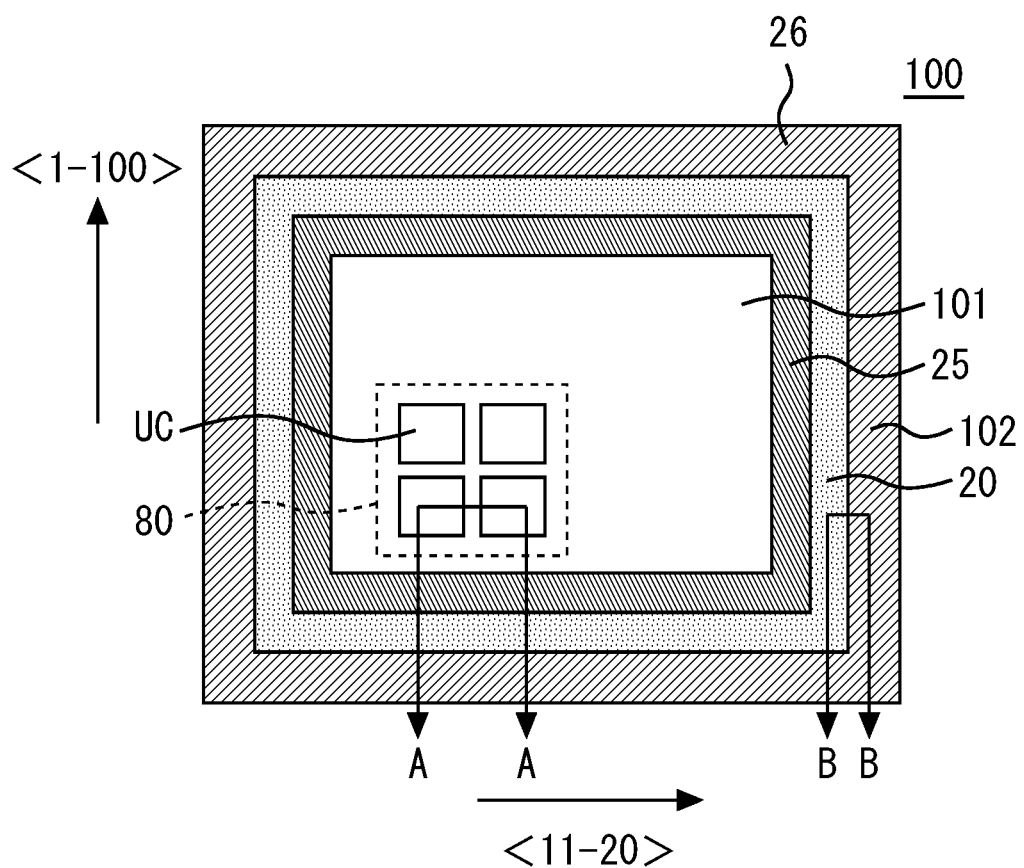
FIG. 1 is a plan view of a semiconductor device according to a first embodiment.

A semiconductor device according to an embodiment of the present disclosure is described with reference to drawings. Identical or corresponding constitutional elements are given the same reference numerals, and the repeated description of such constitutional elements may be omitted.

First Embodiment

FIG. 1 is a plan view of a semiconductor device 100 according to a first embodiment. In the following description, an n type is a first conductive type, and a p type is a second conductive type. However, the types are not limited to these, and the n type may be the second conductive type, and the p type may be the first conductive type. Further, an active region indicates a region through which a principal current of the semiconductor device flows. Further, a termination region indicates a region provided around the active region. Note that part of electrodes and insulating films is omitted in FIG. 1 to explain a structure of the semiconductor device 100.

The semiconductor device 100 has a rectangular shape in plan view. The semiconductor device 100 constitutes a semiconductor chip. In a center portion of the semiconductor device 100, an active region 101 in which an SiC-MOSFET (metal-oxide-semiconductor field-effect transistor) is formed is provided. A termination region 102 is provided in a peripheral portion of the semiconductor device 100. In the termination region 102, a gate wiring 25 is provided so as to enclose the active region 101. A p-type high concentration region 20 is provided outside the gate wiring 25 so as to enclose the active region 101.

In a region 80, unit cells UC are illustrated for descriptive purpose. In an actual device structure, a plurality of unit cells UC are provided within the active region 101. Source regions of the plurality of unit cells UC are electrically connected in parallel.

Figure 2:
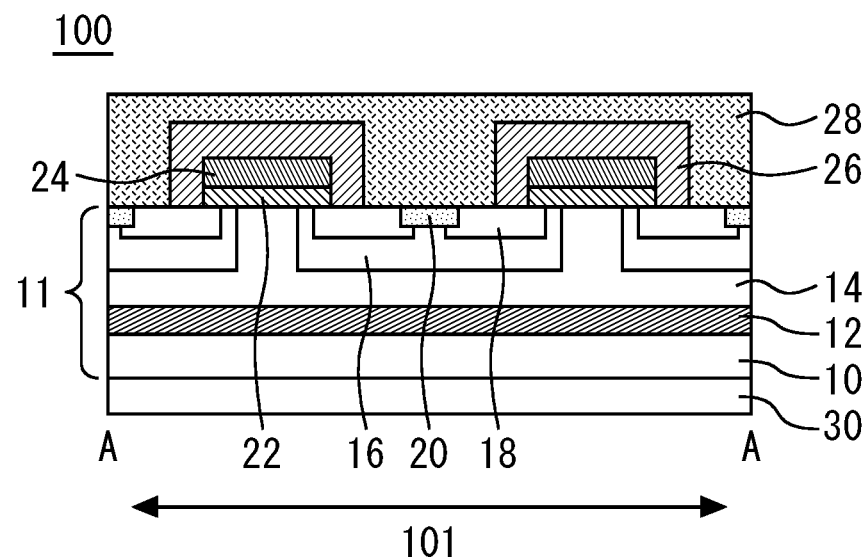
FIG. 2 is a cross-section view along A-A in FIG. 1.
Figure 3:
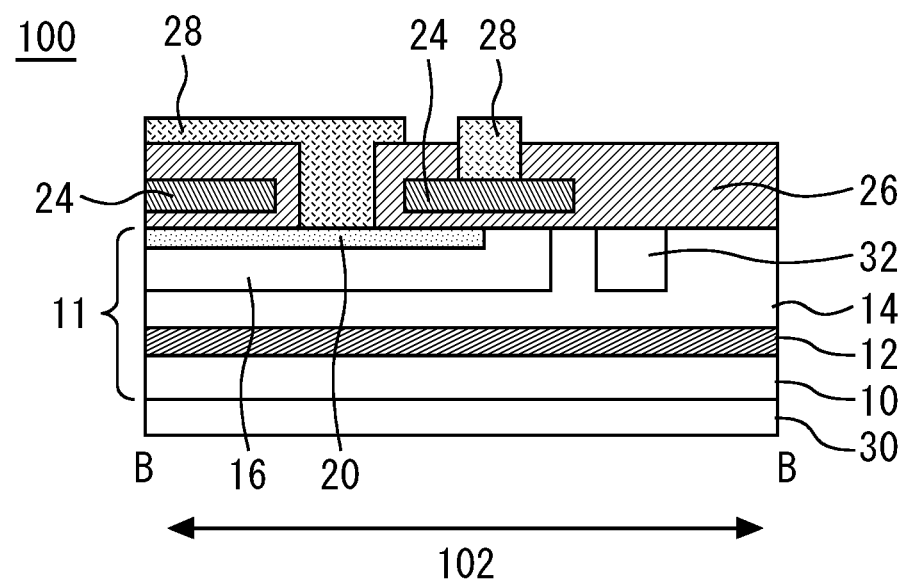
FIG. 3 is a cross-section view along B-B in FIG. 1.

FIG. 2 is a cross-section view along A-A in FIG. 1. FIG. 3 is a cross-section view along B-B in FIG. 1. The semiconductor device 100 includes a semiconductor layer 11, a plurality of gate electrodes 24 provided on an upper surface of the semiconductor layer 11, a source electrode 28 provided on the upper surface of the semiconductor layer 11, and a drain electrode 30 provided on an opposite surface of the upper surface of the semiconductor layer 11. The semiconductor layer 11 includes the active region 101 in which an MOSFET is formed, and the termination region 102 enclosing the active region 101 in plan view. The semiconductor layer 11 is made with silicon carbide.

The semiconductor layer 11 includes a substrate 10 which includes n-type impurities and which is made with SiC. A first semiconductor layer 12 is provided on an upper surface of the substrate 10. The first semiconductor layer 12 is an epitaxial growth layer including n$^+$ type impurities. The first semiconductor layer 12 has concentration higher than concentration of the substrate 10. The first semiconductor layer 12 has an impurity concentration of, for example, equal to or greater than $4 \times 10^{18}$ cm$^{-3}$ and has a thickness of equal to or greater than 4 μm. The first semiconductor layer 12 has a function as a buffer layer. A second semiconductor layer 14 having impurity concentration lower than the impurity concentration of the first semiconductor layer 12 is provided on an upper surface of the first semiconductor layer 12. The second semiconductor layer 14 is an epitaxial growth layer including n-type impurities.

In the active region 101, a p-type well region 16 is provided on an upper surface side of the second semiconductor layer 14. The well region 16 has an impurity concentration of, for example, $1 \times 10^{18}$ cm$^{-3}$. A plurality of well regions 16 are selectively provided on an outermost surface of the second semiconductor layer 14. An n-type source region 18 is provided on an upper surface side of the well region 16. Further, on the upper surface side of the well region 16, a p-type high concentration region 20 is provided between adjacent source regions 18. The high concentration region 20 is also referred to as a well contact region. The high concentration region 20 has an impurity concentration of, for example, $1 \times 10^{20}$ cm$^{-3}$.

Also in the termination region 102, the well region 16 is provided on an upper surface side of the second semiconductor layer 14. In the termination region 102, a p-type high concentration region 20 having impurity concentration higher than the impurity concentration of the well region 16 is provided on an upper surface side of the well region 16. The high concentration region 20 in the active region 101 and the high concentration region 20 in the termination region 102 are in the same layer. The high concentration regions 20 in the active region 101 and in the termination region 102 are formed at the same time.

A withstand voltage maintaining region 32 is provided on the upper surface side of the second semiconductor layer 14 in the termination region 102. The withstand voltage maintaining region 32 has an impurity concentration of, for example, $1 \times 10^{18}$ cm$^{-3}$. The high concentration region 20 has impurity concentration higher than the impurity concentration of the withstand voltage maintaining region 32. The withstand voltage maintaining region 32 is provided on a periphery of the well region 16 in the termination region 102. The arrangement and the impurity concentration of the withstand voltage maintaining region 32 are changed in accordance with a required withstand voltage class.

In the active region 101, a gate insulating film 22 is provided on the upper surface of the second semiconductor layer 14. In the active region 101, the gate insulating film 22 is provided from an upper surface of a portion put between the well regions 16 among the second semiconductor layer 14 to upper surfaces of edge portions of the source regions 18 through upper surfaces of the well regions 16. The gate electrode 24 is provided on the gate insulating film 22. The gate electrode 24 is provided immediately above a portion put between the well regions 16 among the second semiconductor layer 14, the well region 16 and the source region 18. The gate insulating film 22 and the gate electrode 24 are covered with an interlayer insulating film 26. The interlayer insulating film 26 is covered with a source electrode 28. In the active region 101, the source electrode 28 is in contact with and electrically connected to a portion not covered with the interlayer insulating film 26 among the source region 18 and the high concentration region 20.

In the termination region 102, the gate electrode 24 is provided immediately above the high concentration region 20 via an insulating film. In the example in FIG. 3, one of the plurality of gate electrodes 24 is provided immediately above a portion put between the well region 16 and the withstand voltage maintaining region 32 among the second semiconductor layer 14, the well region 16 and the high concentration region 20. Further, the source electrode 28 extends to the termination region 102. In the termination region 102, the source electrode 28 is in contact with and electrically connected to a portion not covered with the interlayer insulating film 26 among the high concentration region 20. The source electrode 28 passes through between gate electrodes 24 provided on the termination region 102 and adjacent to each other and is electrically connected to the high concentration region 20.

When a principal current is applied in the semiconductor device 100, a current flows in a direction from the drain electrode 30 toward the source electrode 28. In this event, the semiconductor device 100 operates as an MOSFET. Further, when a reverse current is applied, a current flows in a direction from the source electrode 28 toward the drain electrode 30. In this event, the semiconductor device 100 operates as a PN diode. The PN diode parasitic inside the semiconductor device 100 is also referred to as a body diode.

When the PN diode operates, there is a case where electrical characteristics of the semiconductor device degrade in accordance with increase in a current application period. There is a case where a BPD (basal plane dislocation) is formed in the epitaxial growth layer in the SiC substrate. Typically, if a hole current flows through a region in which the BPD is formed, the BPD grows, and a stacking fault occurs. This may cause increase in a resistance value in an ON state, decrease in a device withstand voltage, and the like.

To prevent this phenomenon, it is conceivable to reduce BPDs or prevent application of a current having hole density equal to or greater than fixed density which is a cause of growth of the BPD.

In contrast, in the present embodiment, the p-type high concentration region 20 is provided within the termination region 102. This enables a region with high hole density which is a cause of expansion of a crystal fault to be formed in the termination region 102, which can make it easier to cause a hole current to flow through the termination region 102. It is therefore possible to prevent expansion of a crystal fault to the active region 101 and thereby prevent degradation of electrical characteristics of the semiconductor device 100.

Further, the high concentration region 20 is in contact with the source electrode 28 in the termination region 102. This enables a PN diode different from the active region 101 to be formed in the termination region 102, which makes it possible to concentrate current paths from the source electrode 28 in the termination region 102. It is therefore possible to further limit a region through which a hole current flows.

Figure 4:
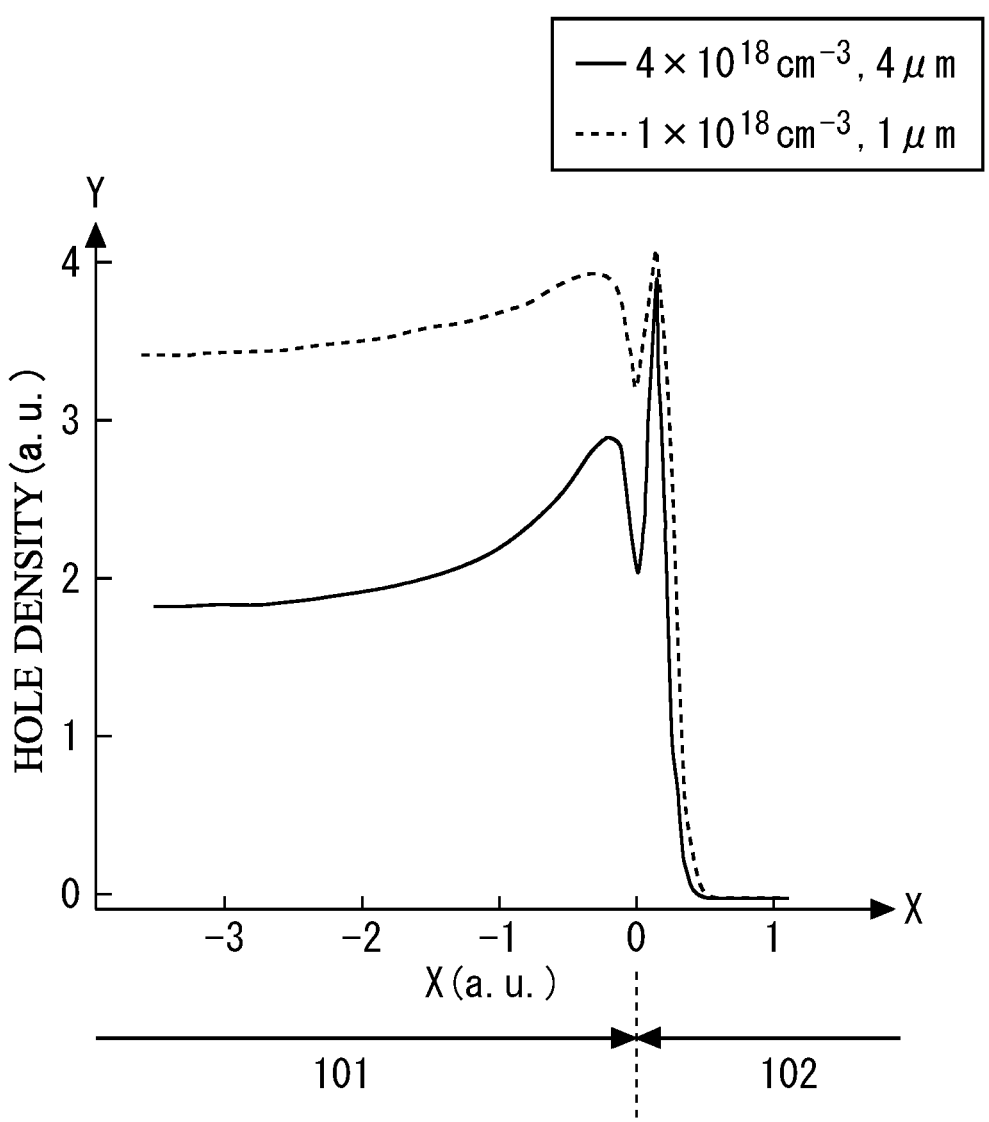
FIG. 4 is a graph for explaining a relationship between the first semiconductor layer and the hole density.

FIG. 4 is a graph for explaining a relationship between the first semiconductor layer 12 and the hole density. FIG. 4 indicates simulation results of the hole density around a boundary between the active region 101 and the termination region 102 when a reverse current is applied in the semiconductor device 100. A point at which X=0 corresponds to an interface between the active region 101 and the termination region 102. A region where X is positive is the termination region 102, and a region where X is negative is the active region 101. The hole density indicates hole density around an interface with the first semiconductor layer 12 among the substrate 10.

A solid line in FIG. 4 indicates a result in a case where the first semiconductor layer 12 has an impurity concentration of $4\times10^{18}$ cm$^{-3}$ and has a thickness of 4 μm. A dashed line in FIG. 4 indicates a result in a case where the first semiconductor layer 12 has an impurity concentration of $1\times10^{18}$ cm$^{-3}$ and has a thickness of 1 μm.

As indicated in FIG. 4, in a case where the first semiconductor layer 12 has an impurity concentration of $4\times10^{18}$ cm$^{-3}$ and has a thickness of 4 μm, the hole density within the active region 101 can be reduced compared to a case where the first semiconductor layer 12 has an impurity concentration of $1\times10^{18}$ cm$^{-3}$ and has a thickness of 1 μm. As the impurity concentration of the first semiconductor layer 12 is made higher or as the thickness of the first semiconductor layer 12 is made thicker, an effect on reduction of the hole density becomes greater. The first semiconductor layer 12 has a function of stemming the hole current flowing with a current when the PN diode operates in the active region 101. Thus, the first semiconductor layer 12 can reduce hole density of the active region 101.

In a case where the first semiconductor layer 12 has an impurity concentration of $4\times10^{18}$ cm$^{-3}$ and has a thickness of 4 μm, the hole density of the termination region 102 becomes equal to or greater than 1.5 times of the hole density of the active region 101. In this event, it is particularly possible to sufficiently prevent expansion of a crystal fault to the active region 101 and thereby prevent degradation of electrical characteristics of the semiconductor device 100.

Further, in the present embodiment, the gate electrode 24 are provided also in the termination region 102. In the termination region 102, as a result of the gate electrodes 24 being provided immediately above the high concentration region 20 and the well region 16, a potential of the termination region 102 can be stabilized. In particular, a potential around the well region 16 can be stabilized. By this means, characteristics of the PN diode within the termination region 102 can be stabilized, so that it is possible to stably control the hole density. It is therefore possible to prevent degradation of electrical characteristics of the semiconductor device 100.

The structure of the semiconductor device 100 is not limited to that described above. The semiconductor device 100 only requires to be an MOSFET including a parasitic diode. Further, concentration of each layer is an example. Still further, if there is no problem in characteristics of the PN diode in the termination region 102, the gate electrode 24 does not have to be provided in the termination region 102.

These modifications can be applied, as appropriate, to a semiconductor device according to the following embodiments. Note that the semiconductor device according to the following embodiment is similar to that of the first embodiment in many respects, and thus differences between the semiconductor device according to the following embodiment and that of the first embodiment will be mainly described below.

Second Embodiment

Figure 5:
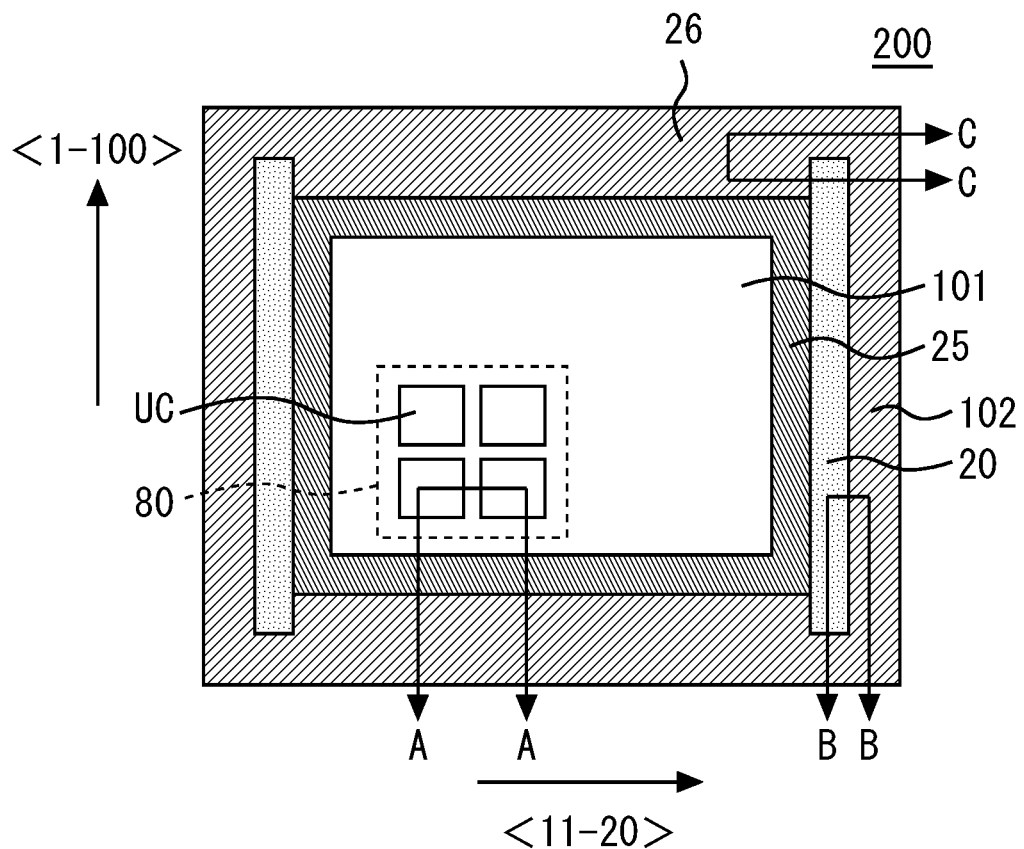
FIG. 5 is a plan view of a semiconductor device according to a second embodiment.

FIG. 5 is a plan view of a semiconductor device 200 according to a second embodiment. The semiconductor device 200 is different from the semiconductor device 100 in a position at which the high concentration region 20 is formed. The rest of the structure is similar to that of the semiconductor device 100. The high concentration region 20 in the termination region 102 of the semiconductor device 200 is formed only on sides along a <1-100> direction among four sides of the termination region 102 enclosing the active region 101 in plan view.

Figure 6:
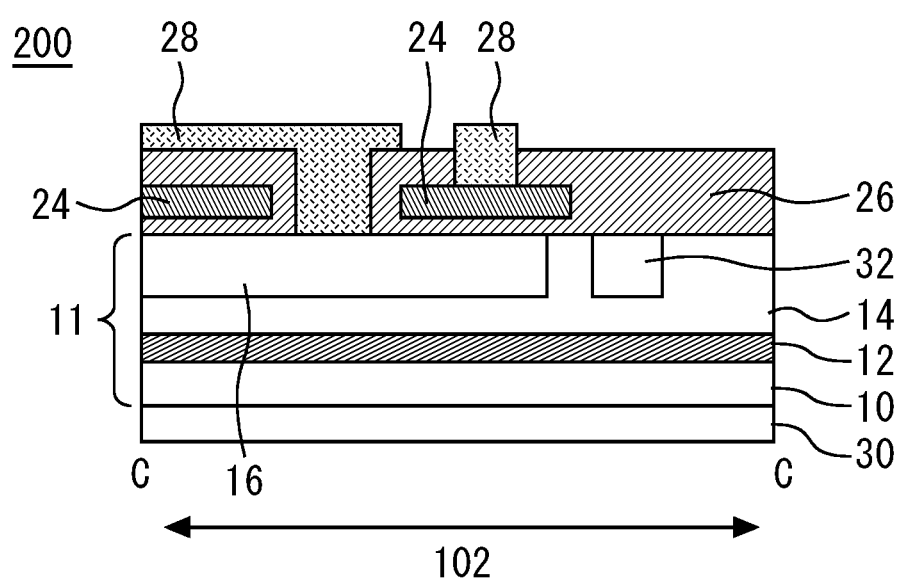
FIG. 6 is a cross-section view along C-C in FIG. 5.

FIG. 6 is a cross-section view along C-C in FIG. 5. The high concentration region 20 which is a p$^+$ type impurity implantation region is not formed on sides along a <11-20> direction of the termination region 102.

Such a high concentration region 20 can be formed using a photolithography technique. The high concentration region 20 can be formed by ion-planting p-type impurities to the semiconductor layer 11 using a resist mask that is closed on the sides along the <11-20> direction, and open on the sides along the <1-100> direction.

A fault growth direction is the <1-100> direction indicated in FIG. 5. Thus, in a case where the high concentration region 20 is formed on two sides parallel to the <11-20> direction among the termination region 102, there is a possibility that a fault may expand to the active region 101 originating from a BPD occurring in the termination region 102. In the present embodiment, the high concentration region 20 is not formed on the two sides parallel to the <11-20> direction. It is therefore possible to limit a region that becomes origination of expansion of a crystal fault. It is therefore possible to prevent expansion of a crystal defect toward a center portion of the active region 101, so that it is possible to further prevent degradation of electrical characteristics of the semiconductor device 200.

Note that the technical features described in the above embodiments may be combined as appropriate.

REFERENCE SIGNS LIST 10 substrate, 11 semiconductor layer, 12 first semiconductor layer, 14 second semiconductor layer, 16 well region, 18 source region, 20 high concentration region, 22 gate insulating film, 24 gate electrode, 25 gate wiring, 26 interlayer insulating film, 28 source electrode, 30 drain electrode, 32 withstand voltage maintaining region, 100 semiconductor device, 101 active region, 102 termination region, 200 semiconductor device, UC unit cell

The invention claimed is:
1. A semiconductor device comprising:
a semiconductor layer comprising an active region in which a MOSFET is formed and a termination region enclosing the active region in plan view;
a gate electrode provided on an upper surface of the semiconductor layer;
a source electrode provided on the upper surface of the semiconductor layer; and a drain electrode provided on an opposite surface of the upper surface of the semiconductor layer,
wherein the semiconductor layer comprises:
a first semiconductor layer of a first conductive type;
a second semiconductor layer of the first conductive type, provided on an upper surface of the first semiconductor layer and having impurity concentration lower than impurity concentration of the first semiconductor layer;
a well region of a second conductive type, provided on an upper surface side of the second semiconductor layer in the active region;
a source region of the first conductive type, provided on an upper surface side of the well region;
a high concentration region of the second conductive type, provided on the upper surface side of the second semiconductor layer in the termination region and having impurity concentration higher than impurity concentration of the well region; and
an additional gate electrode provided entirely in the termination region, such that the high concentration region extends below a portion of the additional gate electrode less than an entirety of the additional gate electrode,
the gate electrode is provided immediately above the well region,
the source electrode is electrically connected to the source region and the high concentration region, and
the first semiconductor layer has an impurity concentration of equal to or greater than $4\times10^{18}$ cm$^{-3}$ and has a thickness of equal to or greater than 4 μm.

2. The semiconductor device according to claim 1, further comprising:
an other gate electrode in the termination region and adjacent to the additional gate electrode,
wherein the source electrode passes between the additional gate electrode and the other gate electrode.

3. The semiconductor device according to claim 1, further comprising:
a withstand voltage maintaining region provided on the upper surface side of the second semiconductor layer in the termination region,
wherein the high concentration region has impurity concentration higher than impurity concentration of the withstand voltage maintaining region.

4. The semiconductor device according to claim 1, wherein the semiconductor layer is made with silicon carbide.

5. The semiconductor device according to claim 1, wherein the high concentration region is formed only on sides along a <1-100> direction among four sides of the termination region enclosing the active region in plan view.

6. A semiconductor device comprising:
a semiconductor layer comprising an active region in which a MOSFET is formed and a termination region enclosing the active region in plan view;
a gate electrode provided on an upper surface of the semiconductor layer;
a source electrode provided on the upper surface of the semiconductor layer; and
a drain electrode provided on an opposite surface of the upper surface of the semiconductor layer,
wherein the semiconductor layer comprises:
a first semiconductor layer of a first conductive type;
a second semiconductor layer of the first conductive type, provided on an upper surface of the first semiconductor layer and having impurity concentration lower than impurity concentration of the first semiconductor layer;
a well region of a second conductive type, provided on an upper surface side of the second semiconductor layer in the active region;
a source region of the first conductive type, provided on an upper surface side of the well region; and
a high concentration region of the second conductive type, provided on the upper surface side of the second semiconductor layer in the termination region and having impurity concentration higher than impurity concentration of the well region,
the gate electrode is provided immediately above the well region,
the source electrode is electrically connected to the source region and the high concentration region,
the first semiconductor layer has an impurity concentration of equal to or greater than $4\times10^{18}$ cm$^{-3}$ and has a thickness of equal to or greater than 4 μm, and
the high concentration region is formed only on sides along a <1-100> direction among four sides of the termination region enclosing the active region in plan view.

* * * * *